United States Patent
Chan

(10) Patent No.: US 12,531,561 B2
(45) Date of Patent: Jan. 20, 2026

(54) PHASE-LOCKED LOOP CONTROL CIRCUIT, PHASE-LOCKED LOOP CIRCUIT AND CONTROL METHOD THEREOF

(71) Applicant: Realtek Semiconductor Corporation, Hsinchu (TW)

(72) Inventor: Chun-Ching Chan, Hsinchu (TW)

(73) Assignee: Realtek Semiconductor Corporation, Hsinchu (TW)

(*) Notice: Subject to any disclaimer, the term of this patent is extended or adjusted under 35 U.S.C. 154(b) by 22 days.

(21) Appl. No.: 18/817,238

(22) Filed: Aug. 28, 2024

(65) Prior Publication Data

US 2025/0167789 A1 May 22, 2025

Related U.S. Application Data

(60) Provisional application No. 63/602,338, filed on Nov. 22, 2023.

(30) Foreign Application Priority Data

Feb. 23, 2024 (TW) .................. 113106628

(51) Int. Cl.
*H03L 7/093* (2006.01)
*H03L 7/10* (2006.01)

(52) U.S. Cl.
CPC .............. *H03L 7/093* (2013.01); *H03L 7/104* (2013.01); *H03L 2207/06* (2013.01)

(58) Field of Classification Search
CPC ...... H03L 7/093; H03L 7/104; H03L 2207/06
See application file for complete search history.

(56) References Cited

U.S. PATENT DOCUMENTS 7,046,093 B1 * 5/2006 McDonagh ............. H03L 7/102
  331/34
11,075,638 B1 * 7/2021 Sinha ..................... H03L 7/103
(Continued)

FOREIGN PATENT DOCUMENTS

CN 101262224 B 8/2010

OTHER PUBLICATIONS

P. K. Hanumolu, G.-Y. Wei, and U.-K. Moon, "A Wide-Tracking Range Clock and Data Recovery Circuit," in IEEE Journal of Solid-State Circuits, vol. 43, No. 2, Feb. 2008, pp. 425-439, doi: 10.1109/JSSC.2007.914290.
(Continued)

*Primary Examiner* — Patrick O Neill
(74) *Attorney, Agent, or Firm* — CKC & Partners Co., LLC

(57) ABSTRACT

A PLL circuit includes a reference current generation circuit, a frequency calibration circuit, a magnification adjustment circuit, an oscillation circuit and a front-end circuit. The frequency calibration circuit generates a current adjustment signal according to a target frequency. The magnification adjustment circuit adjusts a reference current to a target frequency current according to the current adjustment signal. The oscillation circuit generates an output clock signal according to the target frequency current. The front-end circuit detects phase and frequency differences between the output clock signal and a reference clock signal to generate a first control signal. The oscillation circuit adjusts an output frequency to be the same as the target frequency based on the first control signal and the target frequency current. When the first control signal shifts, a second control signal is generated to adjust the target frequency current according to the reference current and the second control signal.

20 Claims, 5 Drawing Sheets

(56) References Cited

U.S. PATENT DOCUMENTS

2008/0218277 A1* 9/2008 Tan ........................... H03L 7/18
                                                                331/25
2023/0327677 A1* 10/2023 Fortunato ............... H03L 7/099
                                                                331/1 R

OTHER PUBLICATIONS

A. Arakali, S. Gondi, and P. K. Hanumolu, "Low-Power Supply-Regulation Techniques for Ring Oscillators in Phase-Locked Loops Using a Split-Tuned Architecture," in IEEE Journal of Solid-State Circuits, vol. 44, No. 8, Aug. 2009, pp. 2169-2181, doi:10.1109/JSSC.2009.2022916.

* cited by examiner

12
PHASE-LOCKED LOOP CONTROL CIRCUIT, PHASE-LOCKED LOOP CIRCUIT AND CONTROL METHOD THEREOF

RELATED APPLICATIONS

This application claims priority to U.S. Provisional Application Ser. No. 63/602,338 filed Nov. 22, 2023, and Taiwan Application Serial Number 113106628, filed Feb. 23, 2024, the disclosures of which are incorporated herein by reference in their entireties.

BACKGROUND

Technical Field

The disclosure relates to a phase-locked loop circuit, a phase-locked loop control circuit for controlling an oscillation circuit and a phase-locked loop control method, and particularly relates to a phase-locked loop circuit, a phase-locked loop control circuit for controlling an oscillation circuit and a phase-locked loop control method with a frequency band calibration mechanism and a temperature locking function.

Description of Related Art

In known phase-locked loop circuits, the oscillator may cause output frequency shifting due to process or temperature variations. When the output frequency of the oscillator changes beyond an adjustment range of the phase-locked loop, the phase-locked loop circuit will no longer be in a phase-locked state and will be unable to generate a stable output clock signal.

In the past, the voltage-frequency gain parameter (KVCO) of the oscillator was often increased in order to overcome the problem of output frequency shifting caused by process or temperature variations, so that the oscillator could cover a wider range of process and temperature variations. However, this method amplifies the periodic pulse noise generated when the charge pump (CP) charges the filter circuit, thereby causing the output frequency of the oscillator to generate more phase noise.

SUMMARY

Therefore, one aspect of the present disclosure relates to a phase-locked loop circuit, a phase-locked loop control circuit and a phase-locked loop control method. By adding an additional locking loop, a magnification adjustment circuit and a frequency calibration circuit, a fine-tuning control signal can be provided when the frequency of an oscillator shifts, thereby adjusting the output frequency of the oscillator to be the same as the target frequency.

A phase-locked loop circuit is provided. The phase-locked loop circuit includes a reference current generation circuit, a frequency calibration circuit, a magnification adjustment circuit, an oscillation circuit, and a front-end circuit. The reference current generation circuit is configured to generate a reference current. The frequency calibration circuit is configured to generate a current adjustment signal according to a target frequency. The magnification adjustment circuit is configured to adjust the reference current to a target frequency current according to the current adjustment signal. The oscillation circuit is configured to receive the target frequency current and generate an output clock signal according to the target frequency current. The front-end circuit is configured to detect a phase difference and a frequency difference between the output clock signal and a reference clock signal to generate a first control signal for the oscillation circuit to adjust an output frequency of the output clock signal to be the same as the target frequency based on the first control signal and the target frequency current. Among them, when the first control signal shifts, the front-end circuit is further configured to generate a second control signal for the magnification adjustment circuit to adjust the target frequency current according to a sum of the reference current and the second control signal.

According to an embodiment of the disclosure, the front-end circuit further includes a phase frequency detection circuit, a charge pump, and a filter circuit. The phase frequency detection circuit is configured to detect the phase difference and the frequency difference between the output clock signal and the reference clock signal to generate an error signal. The charge pump is electrically connected to the phase frequency detection circuit and is configured to convert the error signal to an error current signal. The filter circuit is electrically connected to the charge pump and is configured to generate the first control signal and the second control signal according to the error current signal.

According to an embodiment of the disclosure, the filter circuit includes a first capacitor, a resistor, and a second capacitor. The first capacitor is electrically connected to a base voltage terminal. The resistor is electrically connected between the charge pump and the first capacitor. The second capacitor is electrically connected between the charge pump and the base voltage terminal. A voltage across the first capacitor is used as a sampling voltage, and a voltage across the second capacitor is used as the first control signal.

According to an embodiment of the disclosure, the front-end circuit further includes an operational transconductance amplifier (OTA). The OTA is configured to convert a difference between the sampling voltage and a reference voltage into the second control signal, in which the reference voltage corresponds to the target frequency.

According to an embodiment of the disclosure, the front-end circuit further includes a comparator circuit. The comparator circuit is configured to generate an upper-limit control signal and a lower-limit control signal to the frequency calibration circuit when the sampling voltage is out of a reference voltage range, in which the frequency calibration circuit generates the corresponding current adjustment signal according to the target frequency, the upper-limit control signal and the lower-limit control signal.

According to an embodiment of the disclosure, the oscillation circuit is a current-controlled oscillation circuit, and the PLL circuit further includes a voltage-to-current converting circuit. The voltage-to-current converting circuit is disposed between the front-end circuit and the current-controlled oscillation circuit, and is configured to convert the first control signal to a current signal.

According to an embodiment of the disclosure, the voltage-to-current converting circuit includes a metal-oxide-semiconductor field-effect transistor (MOSFET).

According to an embodiment of the disclosure, the PLL circuit further includes a frequency divider. The frequency divider is electrically connected between the oscillation circuit and the front-end circuit.

According to an embodiment of the disclosure, the magnification adjustment circuit includes a plurality of magnification levels. The magnification adjustment circuit selects one of the magnification levels based on the current adjustment signal to adjust the reference current to the target frequency current according to the one of the magnification levels.

According to an embodiment of the disclosure, when the first control signal shifts, the magnification adjustment circuit magnifies the sum of the reference current and the second control signal into a calibration current according to the one of the magnification levels as the target frequency current.

According to an embodiment of the disclosure, the oscillation circuit is a voltage-controlled oscillation circuit.

According to another purpose of the disclosure is to provide a phase-locked loop (PLL) control circuit for controlling an output clock signal of an oscillation circuit. The PLL control circuit includes a reference current generation circuit, a frequency calibration circuit, a magnification adjustment circuit, and a front-end circuit. The reference current generation circuit is configured to generate a reference current. The frequency calibration circuit is configured to generate a current adjustment signal according to a target frequency. The magnification adjustment circuit is configured to adjust the reference current to a target frequency current according to the current adjustment signal, in which the oscillation circuit generates an output clock signal according to the target frequency current. The front-end circuit is configured to detect a phase difference and a frequency difference between the output clock signal and a reference clock signal to generate a first control signal for the oscillation circuit to adjust an output frequency of the output clock signal to be the same as the target frequency based on the first control signal and the target frequency current. When the first control signal shifts, the front-end circuit is further configured to generate a second control signal for the magnification adjustment circuit to adjust the target frequency current according to a sum of the reference current and the second control signal. When the first control signal shifts beyond a control range of the second control signal, the front-end circuit is further configured to generate an upper-limit control signal and a lower-limit control signal for the frequency calibration circuit to generate the corresponding current adjustment signal according to the target frequency, the upper-limit control signal and the lower-limit control signal.

According to an embodiment of the disclosure, the front-end circuit includes a phase frequency detection circuit, a charge pump, and a filter circuit. The phase frequency detection circuit is configured to detect the phase difference and the frequency difference between the output clock signal and the reference clock signal to generate an error signal. The charge pump is electrically connected to the phase frequency detection circuit and is configured to convert the error signal to an error current signal. The filter circuit is electrically connected to the charge pump and is configured to generate the first control signal and the second control signal according to the error current signal.

According to an embodiment of the disclosure, the filter circuit includes a first capacitor, a resistor, and a second capacitor. The first capacitor is electrically connected to a base voltage terminal. The resistor is electrically connected between the charge pump and the first capacitor. The second capacitor is electrically connected between the charge pump and the base voltage terminal. A voltage across the first capacitor is used as a sampling voltage, and a voltage across the second capacitor is used as the first control signal.

According to an embodiment of the disclosure, the front-end circuit further includes an operational transconductance amplifier (OTA). The OTA is configured to convert a difference between the sampling voltage and a reference voltage into the second control signal, in which the reference voltage corresponds to the target frequency.

According to an embodiment of the disclosure, the front-end circuit further includes a comparator circuit. The comparator circuit is configured to generate the upper-limit control signal and the lower-limit control signal for the frequency calibration circuit when the sampling voltage is out of a reference voltage range, so that the frequency calibration circuit generates the corresponding current adjustment signal according to the target frequency, the upper-limit control signal and the lower-limit control signal.

According to an embodiment of the disclosure, the PLL control circuit further includes a frequency divider. The frequency divider is electrically connected between the oscillation circuit and the front-end circuit.

According to an embodiment of the disclosure, the magnification adjustment circuit includes a plurality of magnification levels. The magnification adjustment circuit selects one of the magnification levels based on the current adjustment signal to adjust the reference current to the target frequency current according to the one of the magnification levels.

According to another purpose of the disclosure is to provide a control method of a phase-locked loop (PLL) circuit for controlling an oscillation circuit.

The control method includes performing a frequency calibration operation and performing a PLL operation. Performing the frequency calibration operation includes generating a corresponding current adjustment signal to a magnification adjustment circuit according to a target frequency of the oscillation circuit; providing a reference current to the magnification adjustment circuit; and adjusting the reference current to a target frequency current according to the current adjustment signal, so that the oscillation circuit generates an output clock signal according to the target frequency current. Performing the PLL operation includes using a front-end circuit to detect a phase difference and a frequency difference between the output clock signal and a reference clock signal; and generating a first control signal for the oscillation circuit to adjust an output frequency of the output clock signal to be the same as the target frequency based on the first control signal and the target frequency current. When the first control signal shifts, the front-end circuit further generates a second control signal for the magnification adjustment circuit to adjust the target frequency current according to a sum of the reference current and the second control signal.

According to an embodiment of the disclosure, when the first control signal shifts beyond a control range of the second control signal, the PLL operation further includes: generating an upper-limit control signal and a lower-limit control signal according to a limit range of the first control signal; generating the adjusted current adjustment signal according to the target frequency, the upper-limit control signal and the lower-limit control signal; and adjusting the target frequency current according to the adjusted current adjustment signal and the reference current.

BRIEF DESCRIPTION OF THE DRAWINGS

In order to make the above and other objects, features, advantages and embodiments of the present disclosure easier to understand, the accompanying drawings are described as follows.

DETAILED DESCRIPTION

Figure 1:
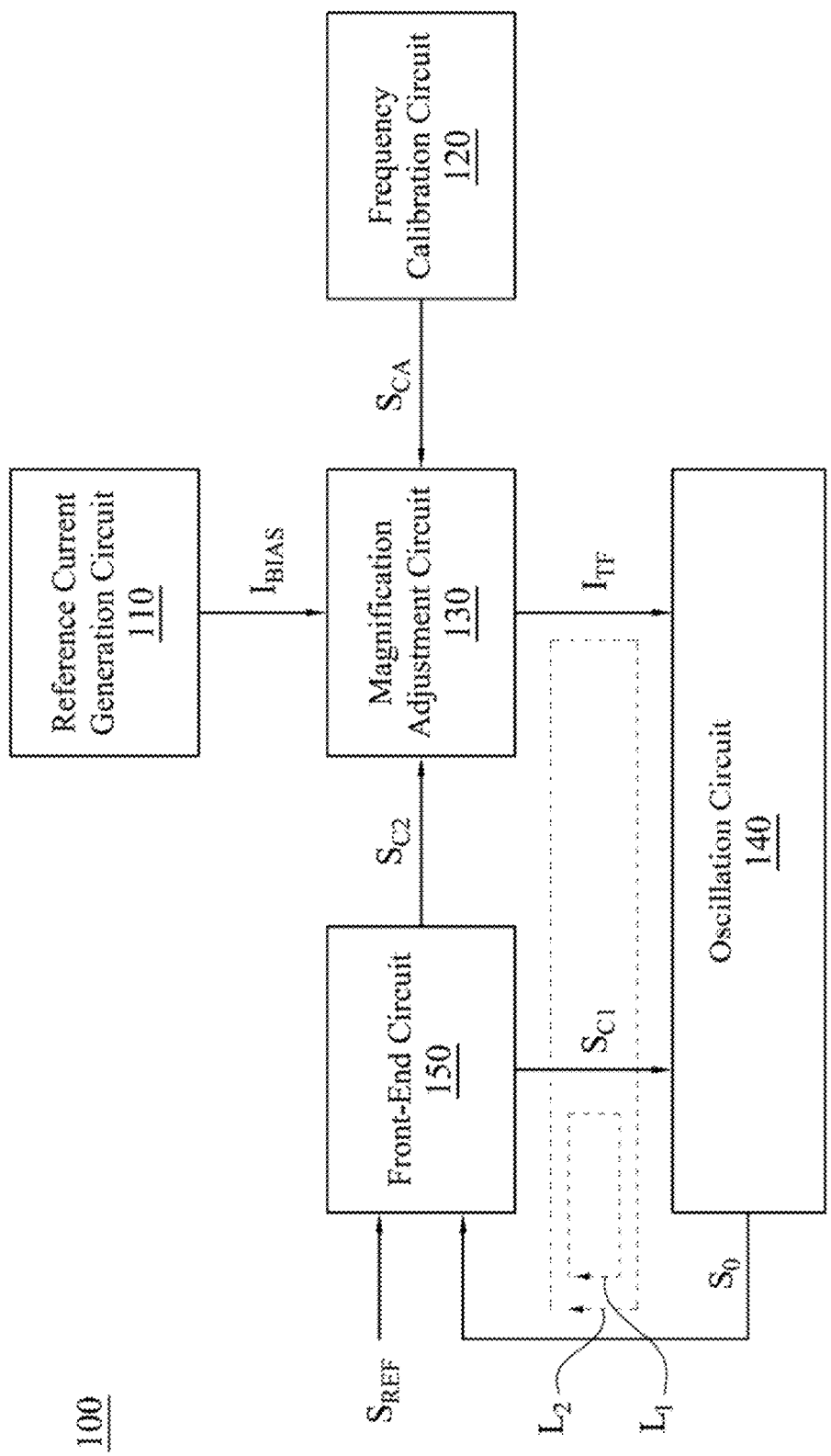
FIG. 1 is a schematic diagram of a phase-locked loop circuit according to an embodiment of the disclosure.

FIG. 1 is a schematic diagram of a phase-locked loop circuit 100 in an embodiment of the disclosure. The phase-locked loop circuit 100 includes a reference current generation circuit 110, a frequency calibration circuit 120, a magnification adjustment circuit 130, an oscillation circuit 140 and a front-end circuit 150.

The reference current generation circuit 110 is configured to generate a reference current $I_{BIAS}$. The reference current $I_{BIAS}$ is a constant current that is stable and not affected by temperature, frequency and processes. The frequency calibration circuit 120 is configured to generate a current adjustment signal $S_{CA}$ according to a target frequency $f_T$ required by the oscillation circuit 140. For example, if the target frequency $f_T$ required by the oscillation circuit 140 is 10 gigahertz (GHz), the frequency calibration circuit 120 will generate the current adjustment signal $S_{CA}$ corresponding to 10 GHZ. Therefore, the oscillation circuit 140 can switch to different frequency bands according to the required target frequency $f_T$.

The magnification adjustment circuit 130 is electrically to the reference current generation circuit 110 and the frequency calibration circuit 120, and is configured to receive the reference current $I_{BIAS}$ and the current adjustment signal $S_{CA}$ to adjust the reference current $I_{BIAS}$ to a target frequency current ITF according to the current adjustment signal $S_{CA}$. In some embodiments, the current adjustment signal $S_{CA}$ includes a plurality of magnification levels. When the magnification adjustment circuit 130 receives the current adjustment signal $S_{CA}$, it will automatically select a suitable magnification level from these magnification levels and adjust the reference current $I_{BIAS}$ to the target frequency current ITF according to this suitable magnification level. For example, if the target frequency $f_T$ of the oscillation circuit 140 is 10 GHZ, the required target frequency current ITF is 1 mA, and the reference current $I_{BIAS}$ is 50 µA. The magnification level of the magnification adjustment circuit 130 needs to be 20 times to adjust the reference current $I_{BIAS}$ to 1 mA, thereby obtaining the target frequency $f_T$ of 10 GHZ. In some embodiments, the magnification adjustment circuit 130 includes 256 magnification levels for adjusting the reference current $I_{BIAS}$ to 256 different values of the target frequency current ITF according to the required target frequency $f_T$.

The oscillation circuit 140 is electrically connected to the magnification adjustment circuit 130 and the front-end circuit 150, and is configured to generate an output clock signal $S_O$ according to the target frequency current ITF, so that the output frequency $f_O$ of the output clock signal $S_O$ is close or equal to the target frequency $f_T$. In other words, before performing a phase-locked loop (PLL) operation, the phase-locked loop circuit 100 can adjust the output frequency $f_O$ of the output clock signal $S_O$ of the oscillator circuit 140 to be close to the target frequency $f_T$ (for example, within a predetermined range of the target frequency $f_T$) in advance according to the target frequency current ITF. During the PLL operation, the phase-locked loop circuit 100 can quickly adjust the output frequency $f_O$ of the output clock signal $S_O$ of the oscillator circuit 140 to be the same as the target frequency $f_T$ because the output frequency $f_O$ of the output clock signal $S_O$ has been initially adjusted to be close to the target frequency $f_T$. As a result, a response time for the phase-locked loop circuit 100 to complete phase locking and reach a stable state can be shortened.

The phase-locked mechanism of the phase-locked loop circuit 100 includes control loops $L_1$ and $L_2$. In the control loop $L_1$, the front-end circuit 150 detects a phase difference and a frequency difference between the output clock signal $S_O$ and a reference clock signal $S_{REF}$ to generate a first control signal $S_{C1}$ to the oscillation circuit 140. The oscillation circuit 140 adjusts the output frequency $f_O$ of the output clock signal $S_O$ to be the same as the target frequency $f_T$ based on the first control signal $S_{C1}$ and the target frequency current ITF. When the first control signal $S_{C1}$ shifts, causing the output frequency $f_O$ of the oscillator circuit 140 to shift, the control loop $L_2$ is triggered and the front-end circuit 150 generates a second control signal $S_{C2}$ for the magnification adjustment circuit 130 to adjust the target frequency current ITF according to a sum of the reference current $I_{BIAS}$ and the second control signal $S_{C2}$. As a result, the oscillator circuit 140 can compensate the shifting amount of the output frequency $f_O$ based on the first control signal $S_{C1}$ and the adjusted target frequency current ITF, so that the output frequency $f_O$ of the adjusted output clock signal $S_O$ is the same as the target frequency $f_T$. Specifically, the magnification adjustment circuit 130 includes an adder circuit. The adder circuit is configured to add the reference current $I_{BIAS}$ and the second control signal $S_{C2}$. Therefore, the magnification adjustment circuit 130 can select a suitable magnification level according to the current adjustment signal $S_{CA}$ provided by the frequency calibration circuit 120, and multiply the sum of the reference current $I_{BIAS}$ and the second control signal $S_{C2}$ by the suitable magnification level to be used as the adjusted target frequency current ITF.

In some embodiments, the oscillation circuit 140 is a current-controlled oscillation circuit which is configured to convert the received current control signal and the target frequency current ITF into the output clock signal $S_O$, and a voltage-to-current converting circuit (not shown) is further included between the front-end circuit 150 and the oscillation circuit 140. The voltage-to-current converting circuit is configured to receive the first control signal Sc outputted from the front-end circuit 150 and convert the first control signal $S_{C1}$ to the current control signal. In some embodiments, the voltage-to-current converting circuit includes transistor(s) such as metal oxide semiconductor field effect transistor(s) (MOSFET). Specifically, the transistor(s) obtains a corresponding drain current by a gate voltage inputted to a gate terminal of the transistor(s) to realize the conversion between voltage and current. In some embodiments, the oscillation circuit 140 is a voltage-controlled oscillation circuit that can directly receive the first control signal $S_{C1}$ as a voltage control signal to control the output clock signal $S_O$ of the oscillation circuit 140, but the disclosure is not limited thereto.

Figure 2:
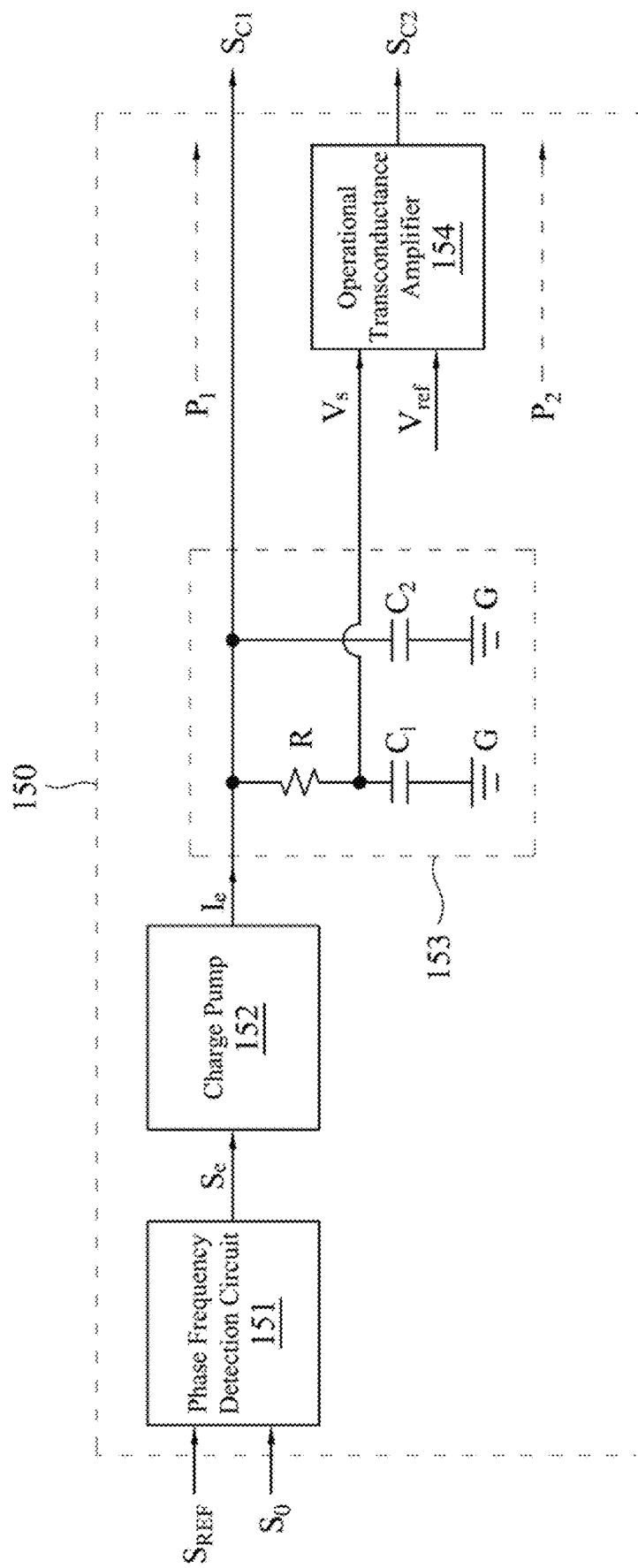
FIG. 2 is a schematic diagram of a front-end circuit according to an embodiment of the disclosure.

FIG. 2 is an internal schematic diagram of the front-end circuit 150 according to an embodiment of the disclosure. The front-end circuit 150 includes a phase frequency detection circuit 151, a charge pump 152, a filter circuit 153, and an operational transconductance amplifier (OTA) 154. Supply paths of control signals include a first path $P_1$ and a second path $P_2$. The phase frequency detection circuit 151 includes two input terminals, in which one of the input terminals receives the reference clock signal $S_{REF}$, and the other input terminal is electrically connected to an output terminal of the oscillator circuit 140 and is used to receive the output clock signal $S_O$. When performing the phase-locked loop mechanism, the phase frequency detection circuit 151 detects the phase difference and the frequency difference between the output clock signal $S_O$ and the reference clock signal $S_{REF}$, and generates an error signal Se at the output terminal of the phase frequency detection circuit 151. The charge pump 152 is electrically connected to the phase frequency detection circuit 151 and is configured to convert the error signal Se to an error current signal $I_e$. The filter circuit 153 is electrically connected to the charge pump 152 and is configured to generate the first control signal $S_{C1}$ and the second control signal $S_{C2}$ at the output terminals of the front-end circuit 150 according to the error current signal $I_e$. The first control signal $S_{C1}$ is supplied to the output terminal of the front-end circuit 150 through the first path $P_1$, and the second control signal $S_{C2}$ is supplied to the output terminal of the front-end circuit 150 through the second path $P_2$.

The filter circuit 153 is a second-order low-pass filter circuit, which includes a first capacitor $C_1$, a resistor R, and a second capacitor $C_2$. The first capacitor $C_1$ is electrically connected to a base voltage terminal. The resistor R is electrically connected between an output terminal of the charge pump 152 and the first capacitor $C_1$. The second capacitor $C_2$ is electrically connected between the charge pump 152 and the base voltage terminal. The base voltage terminal can be a power supply voltage (for example, the common power supply potential VDD) or a ground voltage (for example, the potential of a ground terminal G shown in FIG. 2), and the disclosure is not limited thereto. A voltage across the first capacitor $C_1$ is used as a sampling voltage $V_S$ provided to the OTA 154, and a voltage across the second capacitor $C_2$ is used as the first control signal $S_{C1}$ provided to the oscillation circuit 140. The oscillator circuit 140 can change the output frequency $f_0$ according to the first control signal $S_{C1}$ of the filter circuit 153. When the first control signal $S_{C1}$ shifts, the oscillator circuit 140 can compensate the shifting amount of the output frequency $f_0$ according to the second control signal $S_{C2}$ of the filter circuit 153. Therefore, the frequency and the phase between the reference clock signal $S_{REF}$ and the output clock signal $S_O$ are maintained. In embodiments including the OTA 154, the second control signal $S_{C2}$ is a current control signal.

Specifically, the charge pump 152 generates a forward or reverse error current signal $I_e$ based on the error signal Se, and charges or discharges the first capacitor $C_1$ and the second capacitor $C_2$ of the filter circuit 153 to change the first control signal $S_{C1}$ and the sampling voltage $V_S$ generated by the filter circuit 153. The OTA 154 is configured to receive the sampling voltage $V_S$ and the reference voltage $V_{ref}$, and converts a difference between the sampling voltage $V_S$ and the reference voltage $V_{ref}$ into the second control signal $S_{C2}$. Since the reference voltage $V_{ref}$ corresponds to the desired target frequency $f_T$, when the first control signal $S_{C1}$ shifts after the phase-locked loop circuit 100 is phase-locked, a difference will be generated between the sampling voltage $V_S$ and the reference voltage $V_{ref}$, thereby triggering the OTA 154 to generate the second control signal $S_{C2}$ at the output terminal. As a result, the phase-locked loop circuit 100 can adjust the first control signal $S_{C1}$ to be the same as the reference voltage $V_{ref}$, thereby compensating and correcting the output frequency $f_0$ to the desired target frequency $f_T$.

Figure 3:
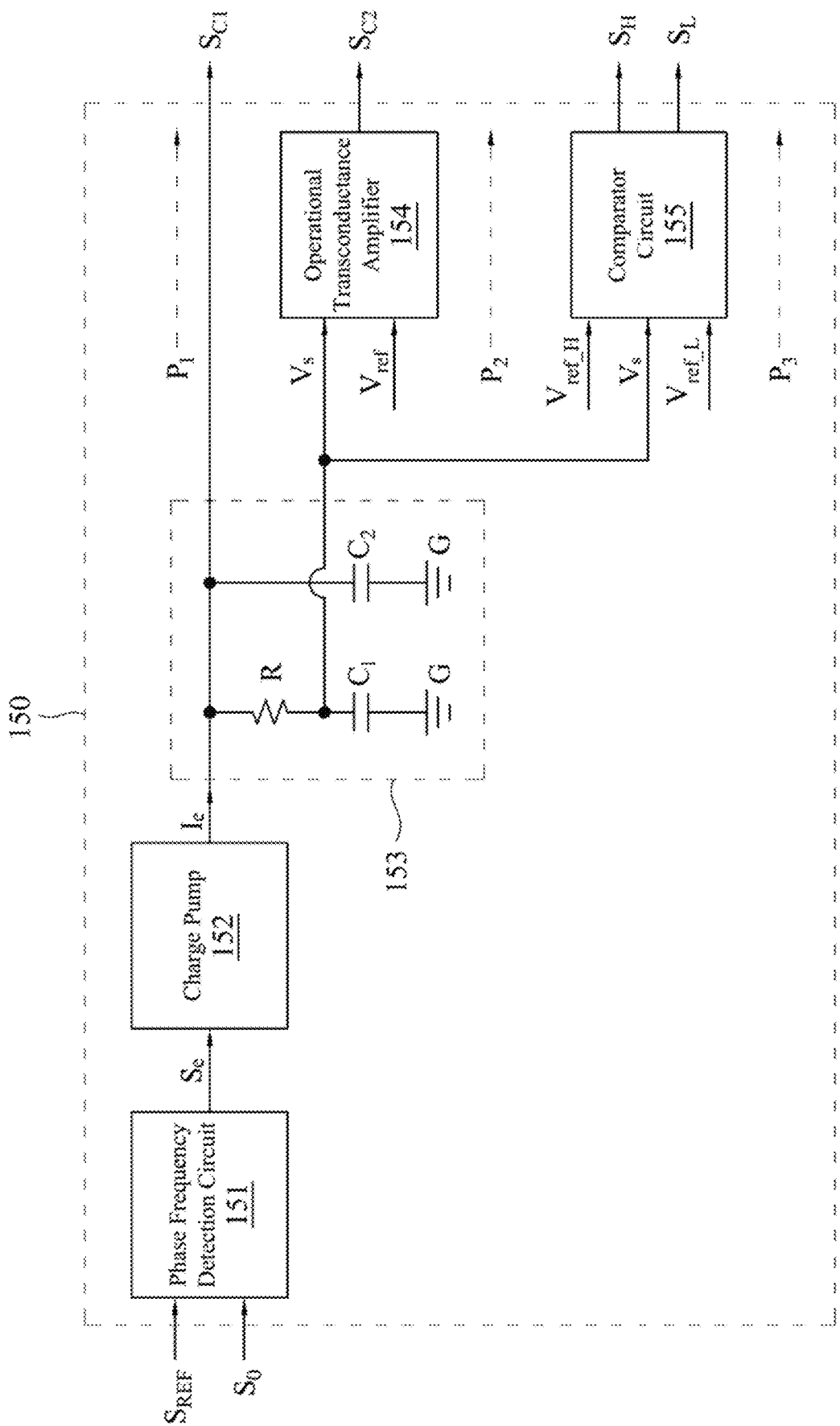
FIG. 3 is a schematic diagram of a front-end circuit according to another embodiment of the disclosure.

FIG. 3 is a schematic diagram of the front-end circuit 150 according to another embodiment of the disclosure. In this embodiment, the front-end circuit 150 includes the phase frequency detection circuit 151, the charge pump 152, the filter circuit 153, the OTA 154 and a comparator circuit 155. The supply paths of the control signals include the first path $P_1$, the second path $P_2$ and a third path $P_3$. Since the operation principles of the phase frequency detection circuit 151, the charge pump 152 and the filter circuit 153 have been described in detail in the embodiment shown in FIG. 2, they will not be described again. Only the operation principle of the comparator circuit 155 is described below. The first control signal $S_{C1}$ is supplied to the output terminal of the front-end circuit 150 through the first path $P_1$, the second control signal $S_{C2}$ is supplied to the output terminal of the front-end circuit 150 through the second path $P_2$, and the upper-limit control signal $S_H$ and the lower-limit control signal SL are supplied to the output terminals of the front-end circuit 150 through the third path $P_3$.

The comparator circuit 155 is electrically connected to the filter circuit 153 and the frequency calibration circuit 120 (not shown in FIG. 3), and is configured to receive the sampling voltage $V_S$ (i.e., the voltage across the first capacitor $C_1$), the upper-limit reference voltage $V_{ref\_H}$ and the lower-limit reference voltage $V_{ref\_L}$. An interval between the upper-limit reference voltage $V_{ref\_H}$ and the lower-limit reference voltage $V_{ref\_L}$ is a controllable range of the reference voltage $V_{ref}$. When the sampling voltage $V_S$ exceeds the controllable range of the reference voltage $V_{ref}$, it means that the shifting degree of the first control signal $S_{C1}$ has exceeded the shifting amount of the output frequency $f_0$ that the second control signal $S_{C2}$ in the second path $P_2$ can compensate, causing the second path $P_2$ to be released from the phase-locked state. At this time, the sampling voltage $V_S$ triggers the comparator circuit 155 to generate the upper-limit control signal $S_H$ and the lower-limit control signal SL to the frequency calibration circuit 120. As a result, the frequency calibration circuit 120 can generate the corresponding current adjustment signal $S_{CA}$ and the target frequency current ITF according to the target frequency $f_T$, the upper-limit control signal $S_H$ and the lower-limit control signal SL, so that the output frequency $f_0$ of the output clock signal $S_O$ of the oscillation circuit 140 can be readjusted to be the same as the target frequency $f_T$.

To provide an example, the target frequency $f_T$ of the oscillation circuit 140 may be 10 GHZ, the reference voltage $V_{ref}$ corresponding to the target frequency $f_T$ of 10 GHz may be 0.55 volts (V), and the controllable range of the reference voltage $V_{ref}$ may be between 0.45 V and 0.65 V. Therefore, in this case, the upper-limit reference voltage $V_{ref\_H}$ of the comparator circuit 155 is set to 0.65 V, and the lower-limit reference voltage $V_{ref\_L}$ is set to 0.45 V. When the shifting amount of the first control signal $S_{C1}$ is between 0.45 V and 0.65 V, it means that it is within the controllable range of the reference voltage $V_{ref}$. Therefore, the front-end circuit 150 does not trigger the third path $P_3$, but outputs the second control signal $S_{C2}$ through the OTA 154 of the second path $P_2$, thereby readjusting the output frequency $f_0$ of the oscillation circuit 140 to be the same as the target frequency $f_T$. On the other hand, if the shifting amount of the first control signal $S_{C1}$ is higher than the upper-limit reference voltage $V_{ref\_H}$ (0.65 V) or is lower than the lower-limit reference voltage $V_{ref\_L}$ (0.45 V), this means that the controllable range of the reference voltage $V_{ref}$ is exceeded. At this time, the front-end circuit 150 triggers the third path $P_3$, causing the comparator circuit 155 to output the upper-limit control signal $S_H$ or the lower-limit control signal SL to the frequency calibration circuit 120, thereby recalibrating the output frequency $f_0$ of the oscillation circuit 140 to be close to the target frequency $f_T$. In some embodiments, the second path $P_2$ using the OTA 154 to generate the second control signal $S_{C2}$ can be omitted, and the comparator circuit 155 can be directly used to generate the upper-limit control signal $S_H$ and the lower-limit control signal SL to compensate the shifting amount of the output frequency $f_0$.

In some embodiments, the phase-locked loop circuit 100 further includes a frequency divider (not shown). The frequency divider is electrically connected between the oscillation circuit 140 and the front-end circuit 150, and is configured to divide the output frequency $f_0$ of the oscillator circuit 140 and output the divided output frequency $f_0$ to the front-end circuit 150. Therefore, in embodiments including the frequency divider, the reference clock signal $S_{REF}$ is actually compared with the divided output clock signal $S_0$ to complete the PLL operation.

Figure 4:
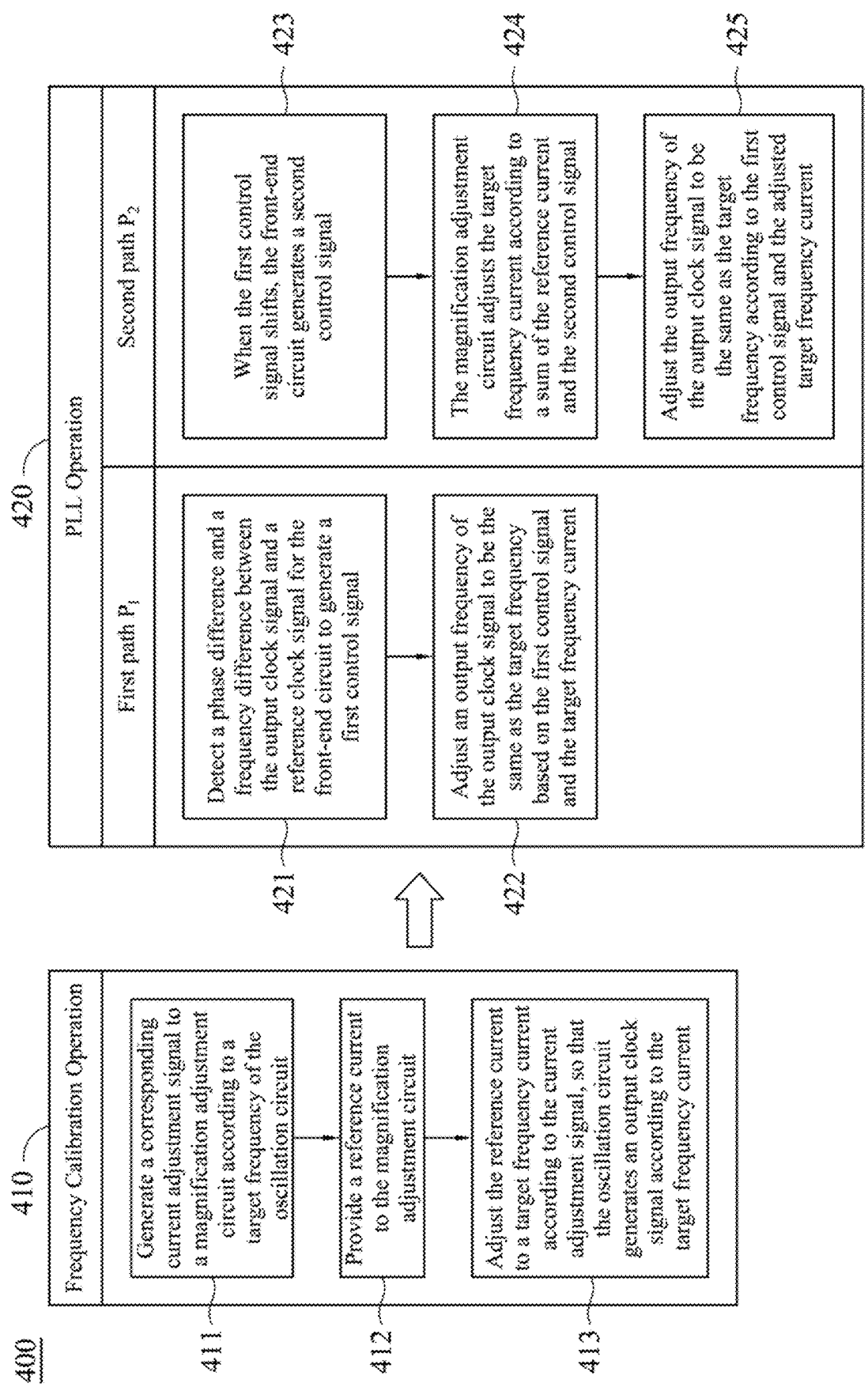
FIG. 4 and FIG. 5 are schematic diagrams of a phase-locked loop control method according to an embodiment of the disclosure.

FIG. 4 is a schematic diagram of a phase-locked loop control method 400 according to an embodiment of the disclosure. The phase-locked loop control method 400 includes a frequency calibration operation 410 and a phase-locked loop (PLL) operation 420. The frequency calibration operation 410 includes Steps 411 to 413. The PLL operation 420 includes Steps 421 to 422. When the output frequency $f_0$ of the oscillator circuit 140 shifts due to process variation or temperature variation, the PLL operation 420 further includes Steps 423 to 425.

Before performing the PLL operation 420, the frequency calibration operation 410 is performed first to adjust the output frequency $f_0$ of the output clock signal $S_0$ to be close to the target frequency $f_T$ (for example, within a predetermined range of the target frequency $f_T$). In Steps 411 and 412, the frequency calibration circuit 120 generates a corresponding current adjustment signal $S_{CA}$ according to a target frequency $f_T$ of the oscillation circuit 140, and the reference current generation circuit 110 provides a reference current $I_{BIAS}$ to the magnification adjustment circuit 130. In Step 413, the magnification adjustment circuit 130 selects a suitable magnification level according to the current adjustment signal $S_{CA}$ to adjust the reference current $I_{BIAS}$ to a target frequency current ITF corresponding to the target frequency $f_T$. Therefore, the output frequency $f_0$ generated by the oscillation circuit 140 according to the target frequency current ITF will be close to the target frequency $f_T$, thereby completing the frequency calibration operation 410 of the phase-locked loop circuit 100.

After performing the frequency calibration operation 410, the PLL operation 420 is performed. In the PLL operation 420, Steps 421 and 422 are performed first (the first path $P_1$ as shown in FIG. 2). In Step 412, the phase frequency detection circuit 151 detects the phase difference and the frequency difference between the output clock signal $S_0$ and the reference clock signal $S_{REF}$, so that the front-end circuit 150 generates the first control signal $S_{C1}$. Next, in Step 422, the oscillator circuit 140 adjusts the output frequency $f_0$ of the output clock signal $S_0$ to be the same as the target frequency $f_T$ based on the first control signal $S_{C1}$ and the target frequency current ITF. Specifically, the PLL operation 420 will repeat Steps 421 and 422 until the output frequency $f_0$ of the output clock signal $S_0$ of the oscillator circuit 140 is the same as the target frequency $f_T$, then the PLL operation 420 is completed. At this time, the phase difference between the output clock signal $S_0$ of the oscillator circuit 140 and the reference clock signal $S_{REF}$ is in a locked state, and the output frequency $f_0$ is the same as the target frequency $f_T$.

When the output frequency $f_0$ of the oscillator circuit 140 shifts due to environmental variations (for example, the ambient temperature increases from −40° C. to 125° C.), the PLL operation 420 triggers the second path $P_2$ shown in FIG. 2 to perform Steps 423 to Step 425. In Step 423, when the first control signal $S_{C1}$ shifts, a difference between the sampling voltage $V_S$ and the reference voltage $V_{ref}$ is generated, thereby triggering the OTA 154 to convert the difference to a current control signal (i.e., the second control signal $S_{C2}$) outputted to the magnification adjustment circuit 130. In Step 424, the adder circuit of the magnification adjustment circuit 130 is used to add the reference current $I_{BIAS}$ and the second control signal $S_{C2}$ to obtain a sum current. Next, based on the current adjustment signal $S_{CA}$ provided by the frequency calibration circuit 120, the sum current is amplified according to a suitable magnification level to be used as the adjusted target frequency current ITF. Specifically, when the output frequency $f_0$ of the oscillation circuit 140 is lower, the second path $P_2$ provides an additional positive current (the second control signal $S_{C2}$) to increase the sum current, thereby increasing the output frequency $f_0$ of the oscillation circuit 140. Otherwise, when the output frequency $f_0$ of the oscillation circuit 140 is higher, the second path $P_2$ provides an additional negative current (the second control signal $S_{C2}$) to decrease the sum current, thereby decreasing the output frequency $f_0$ of the oscillation circuit 140. Therefore, in Step 425, the oscillation circuit 140 can compensate the shifting amount of the first control signal $S_{C1}$ (also equivalent to compensating the shifting amount of the output frequency $f_0$) based on the first control signal $S_{C1}$ and the adjusted target frequency current ITF, so that the output frequency $f_0$ of the adjusted output clock signal $S_0$ is the same as the target frequency $f_T$.

To provide an example, the target frequency $f_T$ of the oscillation circuit 140 may be 10 GHZ, and the required target frequency current ITF may be 1 mA. The reference current $I_{BIAS}$ is 50 µA, and the required magnification level of the magnification adjustment circuit 130 is 20 times. When the ambient temperature variation causes the output frequency $f_0$ of the oscillation circuit 140 to shift by approximately 500 MHZ, the required target frequency current ITF needs to be adjusted to 1.2 mA to adjust the output frequency $f_0$ of the oscillation circuit 140 back to 10 GHz. In this situation, the front-end circuit 150 is triggered to generate a second control signal $S_{C2}$ of about 10 µA. The second control signal $S_{C2}$ and the reference current $I_{BIAS}$ are summed to be about 60 µA. After amplifying 60 µA through the magnification level, an adjusted target frequency current ITF of about 1.2 mA can be obtained. Next, the output frequency $f_0$ is compensated back to 10 GHz according to the adjusted target frequency current ITF. In some embodiments, compared with the reference current $I_{BIAS}$, the current control signal (the second control signal $S_{C2}$) provided through the OTA 154 has a smaller current value. After the phase-locked loop circuit 100 completes phase-locking, if the first control signal $S_{C1}$ shifts, only a small amount of the second control signal $S_{C2}$ will compensate the output frequency $f_0$. Therefore, not only is it ensured that adding the OTA 154 does not generate excessive noise, but the problem of output frequency shifting of the oscillator itself due to process or temperature variations is solved.

Figure 5:
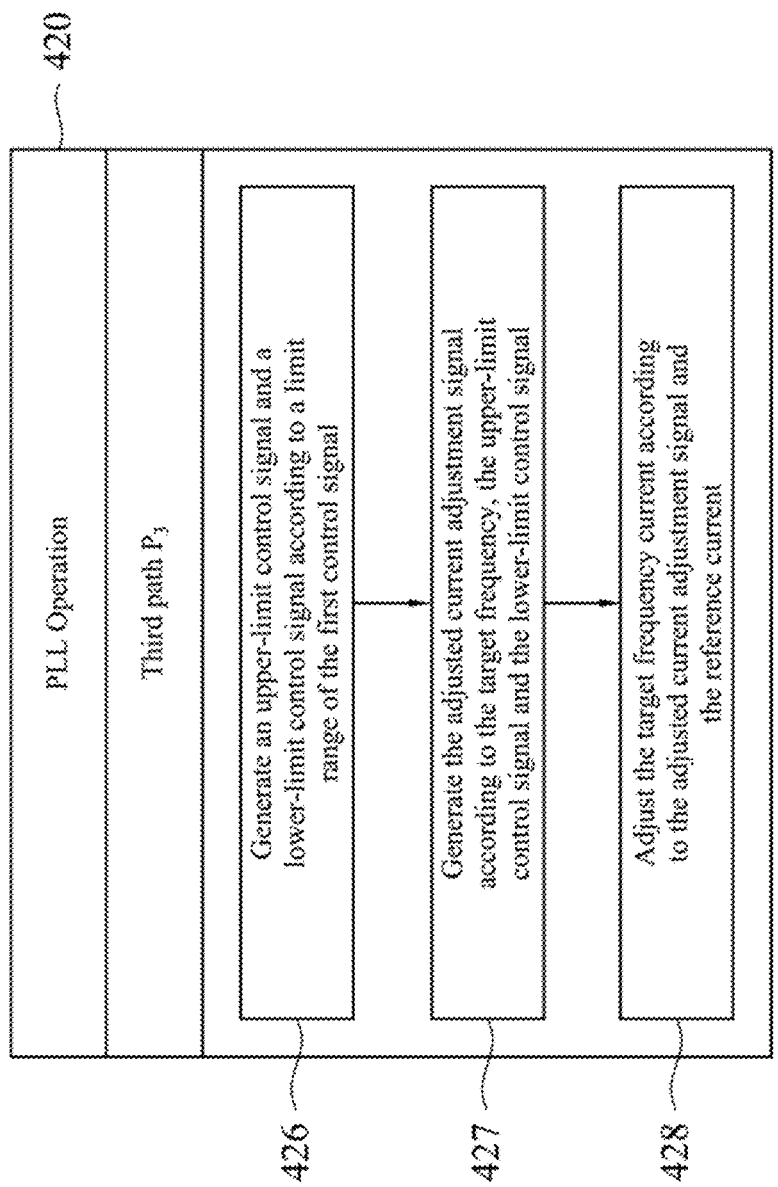

As shown in FIG. 5, in some embodiments of the disclosure, the PLL operation 420 further includes Steps 426 to 428. In Step 426, when the shifting amount of the first control signal $S_{C1}$ exceeds the controllable range of the second control signal $S_{C2}$ in the second path $P_2$ (that is, the first control signal $S_{C1}$ has predetermined upper-limit and lower-limit control ranges), which indicates that the second path $P_2$ is released from phase-locked state. At this time, the comparator circuit 155 is triggered by the upper-limit reference voltage $V_{ref\_H}$ or the lower-limit reference voltage $V_{ref\_L}$ to generate the upper-limit control signal $S_H$ and the lower-limit control signal SL to the frequency calibration circuit 120. In Step 427, the frequency calibration circuit 120 generates the adjusted current adjustment signal $S_{CA}$ according to the target frequency $f_T$, the upper-limit control signal $S_H$ and the lower-limit control signal SL. Subsequently, in Step 428, the magnification adjustment circuit 130 reselects a suitable magnification level according to the adjusted current adjustment signal $S_{CA}$ to magnify the reference current $I_{BIAS}$ to the adjusted target frequency current ITF. As a result, the oscillation circuit 140 can recalibrate the output frequency $f_O$ of the output clock signal $S_O$ to the target frequency $f_T$ based on the adjusted target frequency current ITF. In some embodiments, the phase-locked loop operation 420 omits Steps 423 to 425 of the second path $P_2$ and only includes the first path $P_1$ and the third path $P_3$.

According to the phase-locked loop control circuit, the phase-locked loop circuit and the control method of the disclosure, combined with an additional locking loop, a magnification adjustment circuit and a frequency calibration circuit, control signals are provided to compensate the shifting amount of the output frequency of the oscillator when the output frequency shifts. As a result, the oscillator can respond to output frequency shifting caused by process and temperature variations, and can control the output frequency to be the same as the target frequency under different environments, thereby improving the stability of the phase-locked loop.

Although the description provided above is of various embodiments of the disclosure, this should not limit the scope of the disclosure. Those with ordinary skill in the art can make various modifications without departing from the spirit and scope of the disclosure. Therefore, the scope of protection of the present disclosure shall be determined by the following claims.

What is claimed is:

1. A phase-locked loop (PLL) circuit, comprising:
   a reference current generation circuit configured to generate a reference current;
   a frequency calibration circuit configured to generate a current adjustment signal according to a target frequency;
   a magnification adjustment circuit configured to adjust the reference current to a target frequency current according to the current adjustment signal;
   an oscillation circuit configured to receive the target frequency current and generate an output clock signal according to the target frequency current; and
   a front-end circuit configured to detect a phase difference and a frequency difference between the output clock signal and a reference clock signal to generate a first control signal for the oscillation circuit to adjust an output frequency of the output clock signal to be the same as the target frequency based on the first control signal and the target frequency current;
   wherein when the first control signal shifts, the front-end circuit is further configured to generate a second control signal for the magnification adjustment circuit to adjust the target frequency current according to a sum of the reference current and the second control signal.

2. The PLL circuit of claim 1, wherein the front-end circuit further comprises:
   a phase frequency detection circuit configured to detect the phase difference and the frequency difference between the output clock signal and the reference clock signal to generate an error signal;
   a charge pump electrically connected to the phase frequency detection circuit and configured to convert the error signal to an error current signal; and
   a filter circuit electrically connected to the charge pump and configured to generate the first control signal and the second control signal according to the error current signal.

3. The PLL circuit of claim 2, wherein the filter circuit comprises:
   a first capacitor electrically connected to a base voltage terminal;
   a resistor electrically connected between the charge pump and the first capacitor; and
   a second capacitor electrically connected between the charge pump and the base voltage terminal;
   wherein a voltage across the first capacitor is used as a sampling voltage, and a voltage across the second capacitor is used as the first control signal.

4. The PLL circuit of claim 3, wherein the front-end circuit further comprises:
   an operational transconductance amplifier (OTA) configured to convert a difference between the sampling voltage and a reference voltage into the second control signal, wherein the reference voltage corresponds to the target frequency.

5. The PLL circuit of claim 3, wherein the front-end circuit further comprises:
   a comparator circuit configured to generate an upper-limit control signal and a lower-limit control signal to the frequency calibration circuit when the sampling voltage is out of a reference voltage range, wherein the frequency calibration circuit generates the corresponding current adjustment signal according to the target frequency, the upper-limit control signal and the lower-limit control signal.

6. The PLL circuit of claim 1, wherein the oscillation circuit is a current-controlled oscillation circuit, and the PLL circuit further comprises:
   a voltage-to-current converting circuit between the front-end circuit and the current-controlled oscillation circuit, and configured to convert the first control signal to a current signal.

7. The PLL circuit of claim 6, wherein the voltage-to-current converting circuit comprises a metal-oxide-semiconductor field-effect transistor (MOSFET).

8. The PLL circuit of claim 1, further comprising:
   a frequency divider electrically connected between the oscillation circuit and the front-end circuit.

9. The PLL circuit of claim 1, wherein the magnification adjustment circuit comprises a plurality of magnification levels, and wherein the magnification adjustment circuit selects one of the magnification levels based on the current adjustment signal to adjust the reference current to the target frequency current according to the one of the magnification levels.

10. The PLL circuit of claim 9, wherein when the first control signal shifts, the magnification adjustment circuit magnifies the sum of the reference current and the second control signal into a calibration current according to the one of the magnification levels as the target frequency current.

11. The PLL circuit of claim 1, wherein the oscillation circuit is a voltage-controlled oscillation circuit.

12. A phase-locked loop (PLL) control circuit for controlling an output clock signal of an oscillation circuit, wherein the PLL control circuit comprises:
   a reference current generation circuit configured to generate a reference current;

a frequency calibration circuit configured to generate a current adjustment signal according to a target frequency;
a magnification adjustment circuit configured to adjust the reference current to a target frequency current according to the current adjustment signal, wherein the oscillation circuit generates an output clock signal according to the target frequency current; and
a front-end circuit configured to detect a phase difference and a frequency difference between the output clock signal and a reference clock signal to generate a first control signal for the oscillation circuit to adjust an output frequency of the output clock signal to be the same as the target frequency based on the first control signal and the target frequency current;
wherein when the first control signal shifts, the front-end circuit is further configured to generate a second control signal for the magnification adjustment circuit to adjust the target frequency current according to a sum of the reference current and the second control signal;
wherein when the first control signal shifts beyond a control range of the second control signal, the front-end circuit is further configured to generate an upper-limit control signal and a lower-limit control signal for the frequency calibration circuit to generate the corresponding current adjustment signal according to the target frequency, the upper-limit control signal and the lower-limit control signal.

13. The PLL control circuit of claim 12, wherein the front-end circuit comprises:
a phase frequency detection circuit configured to detect the phase difference and the frequency difference between the output clock signal and the reference clock signal to generate an error signal;
a charge pump electrically connected to the phase frequency detection circuit and configured to convert the error signal to an error current signal; and
a filter circuit electrically connected to the charge pump and configured to generate the first control signal and the second control signal according to the error current signal.

14. The PLL control circuit of claim 13, wherein the filter circuit comprises:
a first capacitor electrically connected to a base voltage terminal;
a resistor electrically connected between the charge pump and the first capacitor; and
a second capacitor electrically connected between the charge pump and the base voltage terminal;
wherein a voltage across the first capacitor is used as a sampling voltage, and a voltage across the second capacitor is used as the first control signal.

15. The PLL control circuit of claim 14, wherein the front-end circuit further comprises:
an operational transconductance amplifier (OTA) configured to convert a difference between the sampling voltage and a reference voltage into the second control signal, wherein the reference voltage corresponds to the target frequency.

16. The PLL control circuit of claim 15, wherein the front-end circuit further comprises:

a comparator circuit configured to generate the upper-limit control signal and the lower-limit control signal for the frequency calibration circuit when the sampling voltage is out of a reference voltage range, so that the frequency calibration circuit generates the corresponding current adjustment signal according to the target frequency, the upper-limit control signal and the lower-limit control signal.

17. The PLL control circuit of claim 12, further comprising:
a frequency divider electrically connected between the oscillation circuit and the front-end circuit.

18. The PLL control circuit of claim 12, wherein the magnification adjustment circuit comprises a plurality of magnification levels, and wherein the magnification adjustment circuit selects one of the magnification levels based on the current adjustment signal to adjust the reference current to the target frequency current according to the one of the magnification levels.

19. A control method of a phase-locked loop (PLL) circuit for controlling an oscillation circuit, wherein the control method comprises:
performing a frequency calibration operation, comprising:
generating a corresponding current adjustment signal to a magnification adjustment circuit according to a target frequency of the oscillation circuit;
providing a reference current to the magnification adjustment circuit; and
adjusting the reference current to a target frequency current according to the current adjustment signal, so that the oscillation circuit generates an output clock signal according to the target frequency current; and
performing a PLL operation, comprising:
using a front-end circuit to detect a phase difference and a frequency difference between the output clock signal and a reference clock signal; and
generating a first control signal for the oscillation circuit to adjust an output frequency of the output clock signal to be the same as the target frequency based on the first control signal and the target frequency current;
wherein when the first control signal shifts, the front-end circuit further generates a second control signal for the magnification adjustment circuit to adjust the target frequency current according to a sum of the reference current and the second control signal.

20. The control method of claim 19, wherein when the first control signal shifts beyond a control range of the second control signal, the PLL operation further comprises:
generating an upper-limit control signal and a lower-limit control signal according to a limit range of the first control signal;
generating the adjusted current adjustment signal according to the target frequency, the upper-limit control signal and the lower-limit control signal; and
adjusting the target frequency current according to the adjusted current adjustment signal and the reference current.

* * * * *